United States Patent [19]

Kotyuk

[11] Patent Number: 5,385,481
[45] Date of Patent: Jan. 31, 1995

[54] ALIGNMENT MECHANISM FOR BLIND-MATABLE CONNECTION FOR TWO OR MORE CONNECTORS

[75] Inventor: Kenneth A. Kotyuk, Morgan Hill, Calif.

[73] Assignee: Tandem Computers Incorporated, Cupertino, Calif.

[21] Appl. No.: 811,190

[22] Filed: Dec. 20, 1991

[51] Int. Cl.⁶ .............................................. H01R 13/64
[52] U.S. Cl. ..................................... 439/378; 439/248
[58] Field of Search .............................. 439/246–252, 439/374–389, 64; 361/413, 414, 415

[56] References Cited

U.S. PATENT DOCUMENTS

| | | | |
|---|---|---|---|
| 3,116,959 | 1/1964 | Abodeely | 439/378 |
| 4,682,833 | 7/1987 | Ferchau et al. | 439/377 |
| 4,853,830 | 8/1989 | Corfits et al. | 439/378 |
| 4,963,098 | 10/1990 | Myer et al. | 439/378 |
| 5,045,960 | 9/1991 | Eding | 439/377 |

Primary Examiner—David L. Pirlot
Attorney, Agent, or Firm—Townsend and Townsend Khourie and Crew

[57] ABSTRACT

A drawer, of the type constructed to carry electronic apparatus, and to be inserted into a cabinet, includes at least two separate connector parts adapted to mate with corresponding connector parts mounted on a backwall or backplane of the cabinet. An alignment mechanism, comprising a pair of alignment pins extending from the cabinet backplane, and multiple pairs of apertures associated with the drawer, each pair corresponding to one connector, function to align the separate connector parts on the drawer to those mounted on the backplane of the cabinet.

15 Claims, 3 Drawing Sheets

ALIGNMENT MECHANISM FOR BLIND-MATABLE CONNECTION FOR TWO OR MORE CONNECTORS

BACKGROUND OF THE INVENTION

The present invention relates generally to blind-matable connection between connector parts, for example when inserting a electronics carrying drawer into a cabinet, electrically connecting the electronics to wiring carried in and by the cabinet. More particularly, the invention relates to a system capable for establishing alignment for blind-matable connection of the parts of multiple, separate connectors.

Some electronics systems today are packaged so that modular portions of the electronics can be easily removably inserted into the system. For example, mass storage systems for digital computing systems are often in the form of multiple magnetic media units (e.g., disk drive units), each mounted in drawers that are removably inserted in a cabinet. Communication between the electronics carried in the drawer and remainder of the electronics system is typically established by a drawer to cabinet interface in the form of connectors having mating connector parts.

This drawer to cabinet interface is often one that preferably permits removable connection of the drawer so that the electronic apparatus carried or contained by the drawer can be quickly and easily replaced or other accessed for maintenance and the like. Thus, the mating of the drawer to the cabinet at this interface would preferably be blind (i.e., blind-matable) so that one need only insert the drawer into the cabinet in a way that permits the connector parts to move into mating connection with no special effort. One method of ensuring such blind-matable connection is to mount the connector parts to the backwall or backplane of the cabinet, and to the backwall of the drawer, so that when the drawer is inserted into the cabinet, an initial alignment is established by, for example, guide rails mounted in the cabinet upon which the drawer slides. As the drawer is moved further into the cabinet, the respective backwalls of the drawer and the cabinet brought into confronting proximate relation, the pre-aligned connector parts are mated. The problem with this technique is that the connector parts of each drawer must be aligned and correctly positioned for each corresponding connector part of the cabinet. A drawer aligned for one cabinet connector part most likely will not align with another connector part on the cabinet unless the two connector parts are compatibly aligned to one another.

There is a blind-matable system, similar to that to which the present invention is directed, which does allow drawers to be inserted in different drawer-receiving cavities of a cabinet without need for checking the alignment compatibility. However, such systems limit the blind-matable connection to alignment of the parts of a single connector or a singular connector with modular forms. If more than one connector is to be used at the drawer-cabinet interface, each must be provided with an alignment system. An example of such an alignment system is found in U.S. Pat. No. 4,682,833.

SUMMARY OF THE INVENTION

The present invention provides an alignment system for simultaneous, blind-matable connection of connector parts of two or more connectors that is inexpensive, simple to construct, and easy to use.

Broadly, the invention comprises a pair of elongate alignment pins that are positioned to extend from the backwall of a cabinet and into the drawer-receiving cavity of the cabinet. The alignment pins are configured to engage at least two or more corresponding apertures associated with the drawer when the drawer is inserted into the cabinet. The engagement of the alignment pins with the apertures operates to register the planes in which pairs of the pin-receiving apertures are formed to the backplane of the cabinet that from which the alignment pins extend. Connector parts are mounted to the planes of the drawer and the backplane of the cabinet, accurately positioned relative to the alignment pins or apertures, as the case may be. Thus, registration of the planes associated with the drawer to that of the cabinet backplane of the cabinet will correspondingly align the connector parts mounted thereto.

More particularly, according to the present invention, a drawer of the type structured to be removably inserted in a drawer-receiving cavity in a cabinet has a backwall integrally formed as a part of the drawer structure, and adapted to be placed in close, confronting relation to a backplane of the cabinet. Mounted to the backwall, somewhat loosely so that it is able to move or "float" in a vertical plane, is a floating mounting plate that carries at least a first connector part mounted thereto relative to the alignment apertures of the floating mounting plate. Formed in the backwall of the drawer is a pair of alignment apertures, and a matching pair of alignment apertures is similarly formed in the floating mounting plate. Each of the alignment apertures of each pair is positioned to be generally aligned with one another. Mounted to the drawer, relative to the pair of apertures formed in the backwall, is a second connector part.

Mounted to the backplane of the cabinet is the pair of alignment pins and the mating connector parts corresponding to those carried by the drawer. The connector parts on the backplane are located relative to the alignment pins, and the alignment pins are positioned so that when the drawer is inserted into the cabinet, and moved to place the backwall of the drawer in confronting relation with the backplane of the cabinet, the alignment pins will pick up and penetrate the pairs of alignment apertures, first those formed in the backwall of the drawer, then those formed in the floating mounting plate. The alignment pins, and alignment apertures they enter, are formed and configured so that their respective engagement will, first, register the backwall with the backplane of the cabinet; second, the floating mounting plate is picked up (by the alignment pins) and moved (hence, the reason for allowing it to "float" or be movable relative to the backwall) to be similarly registered. Registration of planes constituted by (1) the drawer backwall and (2) the mounting plate to (3) that of the backplane will also register anything mounted on those planes, so long as mounted accurately, relative to the apertures/alignment pins.

In a preferred embodiment of the invention, one of each of the pairs of apertures is circularly, having a diameter adapted to snugly receive a corresponding cylindrically configured alignment pin. The other of each of the apertures has an elongated dimension, so that the corresponding other of the alignment pins engages the other aperture to angularly fix the backwall and mounting plate relative to the one alignment pin.

The alignment pins are tapered along their lengths a longer distance than normal so as to establish an initial alignment without the necessity of close alignment of the guiderails on which the drawer slides when being inserted.

In an alternate embodiment of the present invention, two floating mounting plates are attached in stacked relation to the backwall, and each is provided with a pair of alignment apertures generally registered with those of the other of the floating mounting plates and the backwall so that when the drawer is inserted the alignment pins will engage all apertures, aligning all floating mounting plates to the backwall, and to backplane from which the mounting pins project. Each of the floating mounting plates carry connector parts that are aligned with mating connector parts on the backplane through registration and alignment of the respective floating mounting plates location to the corresponding alignment aperture pairs.

There are a number of advantages achieved by the present invention First, the alignment system of the present invention operates to align, simultaneously, more than one connector for blind-matable connection.

Second, the invention can be inexpensive to construct, and easy to use, providing a generally universal alignment in that alignment is completed when the connector parts are mounted to the backwall, mounting plate, and backplane, relative to the alignment mechanism.

Third, the tapering of the alignment pins of the invention allows the drawer to become initially aligned without closely aligned guiderails.

These are other advantages and aspects of the present invention will become apparent to those skilled in the art to which the invention pertains upon a reading of the detailed description, which should be taken in conjunction with the accompanying drawings.

DESCRIPTION OF THE PREFERRED EMBODIMENT

Figure 1:
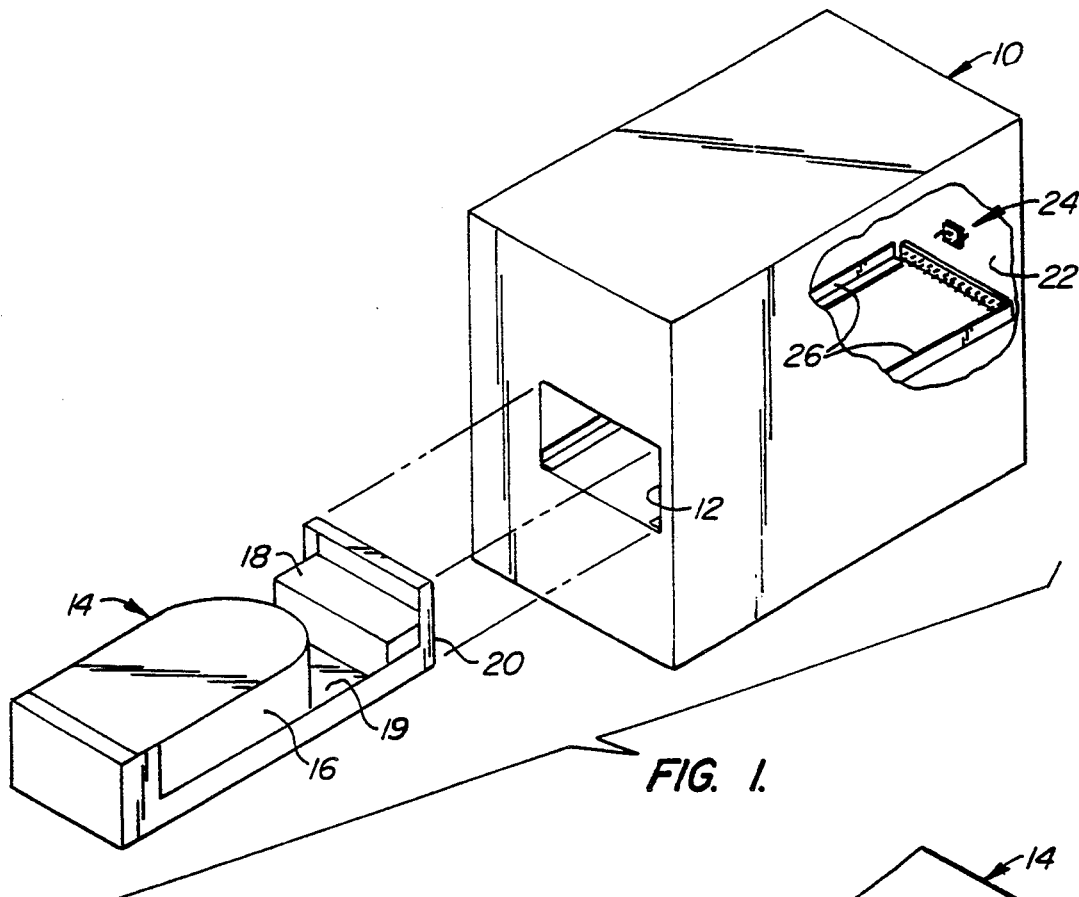
FIG. 1 is a perspective illustration of a drawer-receiving cabinet and drawer implementing the present invention.

Turning now to the Figures, and for the moment particularly FIG. 1, a cabinet 10 is shown with at least one drawer-receiving cavity 12 in which a drawer 14 may be removably received.

The drawer 14 is structured to contain, for example, disk storage media 16, and the electronics 18 for controlling and powering the disk media 16. The electronics 18 is mounted to an underlying printed circuit board 19. The drawer 14 includes a backwall 20, preferably formed integral with the remainder of the drawer 14, at which the connector apparatus will be mounted, as explained below, for effecting an interface with the cabinet 10. The cabinet 10 includes a backplane 22 having mounted thereto (generally indicated as 24 in FIG. 1) mating connector apparatus. Finally, mounted interior of the cabinet 18, and associated with the cavity 12, are guide rails 26. Guide rails 26 operate to establish an initial alignment between the backwall 20 of the drawer 14 with the backplane 22 of the cabinet 10 while the drawer 14 is being inserted in the cavity 12.

Figure 2:
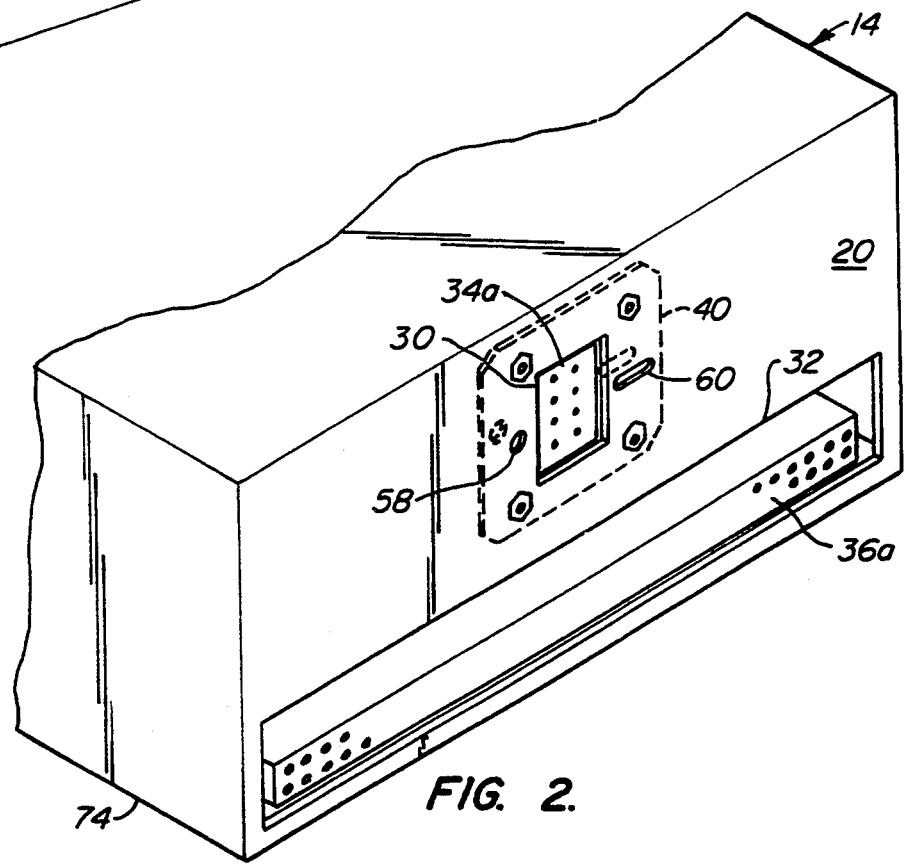
FIG. 2 is an illustration of the backwall of the drawer of FIG. 1, showing that portion of the invention associated with the drawer.

Turning now to FIG. 2, the backwall 20 of the drawer 14 is better illustrated. As shown, the backwall of the drawer 14 has formed therein upper and lower rectangularly shaped openings or accesses 30, 32, both providing access to connector parts 34a, 36a, respectively.

Figure 3:
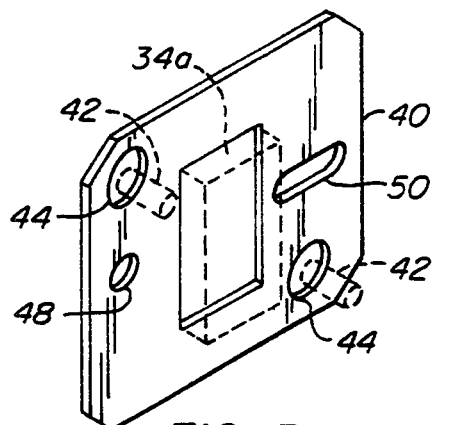
FIG. 3 is an illustration of a mounting plate for a connector part that is used to implement a part of the invention.
Figure 6:
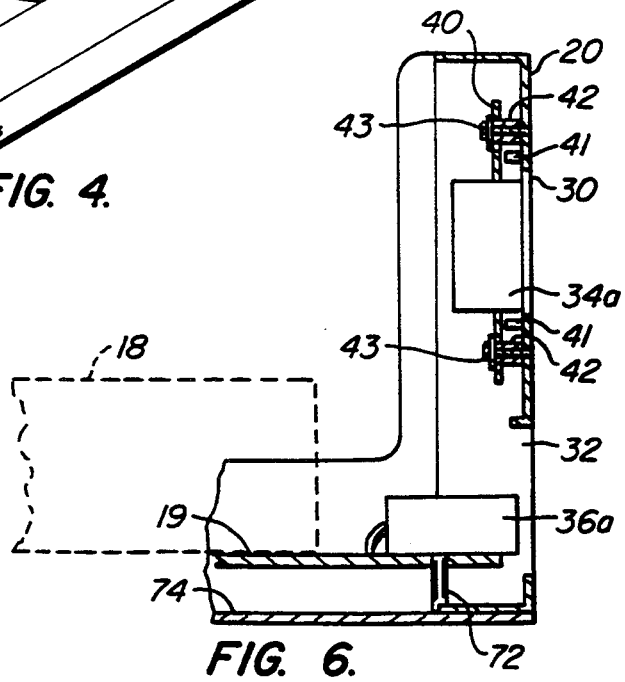
FIG. 6 is a sectional view illustrating the interconnection between the parts of the alignment system, as well as the parts of the connector that establish the drawer to cabinet electronic interface.

As FIG. 2 further illustrates, and as can be also be seen in FIGS. 3 and 6, the connector part 34a (shown in phantom in FIG. 3) is mounted to a mounting plate 40 (illustrated in phantom in FIG. 2) that, in turn, mounts to the interior (to the drawer 14) surface of the backwall 20 by stand-offs 42 (FIGS. 3 and 6). The mounting plate 40, better illustrated in FIG. 3, is formed having mounting apertures 44 at two opposing corners thereof. The stand-offs 42 extend through the apertures 44, from the interior surface of the backplate 20, and are enlarged at their terminus, having a diameter larger than that of aperture 44, in order to hold the floating mounting plate 40 to the stand-offs 42. The interior diameter of the apertures 40 are enlarged, relative to the outer diameter of the stand-offs 42, in order to allow the plate 40 to "float," i.e. to move to somewhat relative to the backwall 20 of the cabinet 14 for reasons that will be explained below. Movement up and down (X and Y direction) of the floating mounting plate 40, relative to the backwall 20, is limited by the stand-offs 42. The stand-offs 42 are threaded internally to receive threaded fastening screws 43 the heads of which have a diameter larger than the diameter of apertures 44. In addition, shorter stand-offs 41 (FIG. 6) are mounted to extend from the backwall 30 toward the floating mounting plate 40. The stand-offs 41 operate with the heads of the fastening screws 43 to limit front and back (Z direction) movement of the floating mounting plate 40 relative to the backwall 30.

Also formed in the floating mounting plate 40 are two alignment apertures 48, 50. As FIG. 3 illustrates, the alignment aperture 48 is substantially circular in nature while the alignment aperture 50 is oblong, i.e., with a lengthwise dimension (which is oriented generally toward the center of the alignment aperture 48) greater than its vertical dimension.

As best illustrated in FIG. 2, the backwall 20 is also provided with substantially similar alignment apertures 58, 60 proximate the rectangular access 30. The floating mounting plate 40, when affixed to the backplate 20, has its alignment apertures 48, 50 placed so that they are somewhat aligned or registered with the alignment apertures 58, 60 of the backwall 20, so that when a pair of alignment pins (described more fully below) protrude through alignment apertures 58, 60, they will also protrude through alignment apertures 48, 50.

As indicated above, the connector part 34a is mounted to the floating mounting plate 40. Connector part 36a, however, is mounted to the printed circuit board 19. The printed circuit board 19 is mounted by upright stubs 72, to the bottomwall 74 (FIG. 2) of the drawer 14. Preferably, the drawer 14 is formed so that the backwall 20 and bottomwall 74 are unitary in structure in order to ensure a locational correspondence between points on the plane defined by the bottomwall 74 and points on the plane defined by the backwall 20. The connector part 36a is mounted to the printed circuit board 19 which, in turn, is mounted to the bottomwall 74. Since the bottomwall 74 is accurately located relative to the backwall 20 of the drawer 14, accurately positioning the printed circuit board 19 on the bottomwall 74 will also accurately locate the connector 36a, carried by the circuit board 19, relative to the alignment apertures 58, 60. Similarly, the connector part 34a is mounted to the mounting plate 40 accurately positioned relative to the alignment apertures 48, 50 formed in mounting plate.

Figure 5:
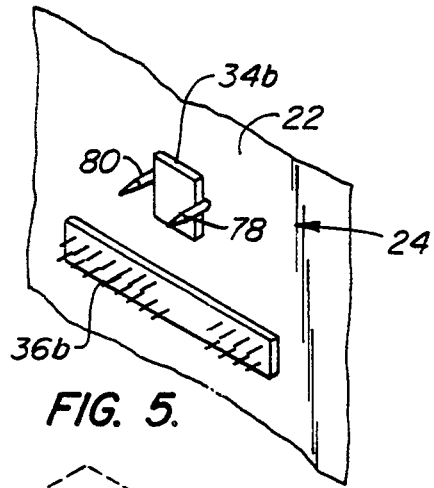
FIG. 5 illustrates the alignment pins used in connection with the present invention, showing them mounted to the backplane of the cabinet of FIG. 1, and relative to the connector parts also mounted to the backplane.
Figure 4:
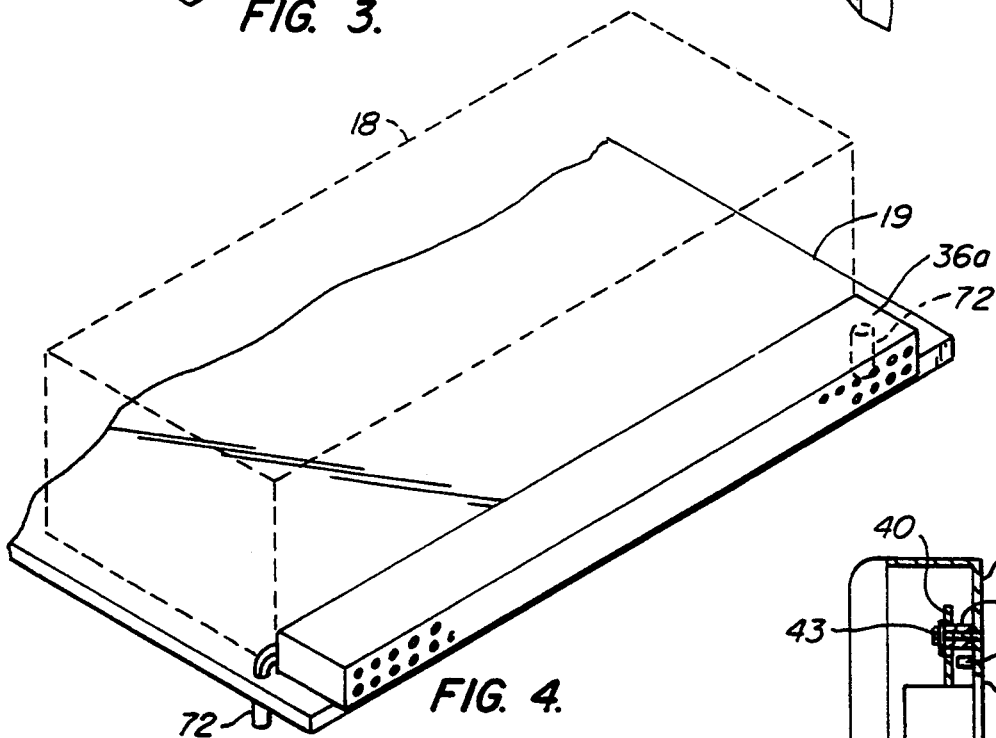
FIG. 4 illustrates a method for mounting one of the connector parts to the drawer.

Referring now to FIG. 5, it can be seen that the backplane 22 carries, as indicated above, the mating connector parts 34b, 36b, which mate with those (34a, 36a) associated with the backwall 20 of the drawer 14. Also mounted to the backwall 22, proximate (and separated by) the connector part 34b, is a pair of alignment pins 78, 80. The alignment pins 78, 80 are substantially identical in configuration, each being substantially cylindrical, with a relatively long taper toward the interior of the cabinet 10. The alignment pins 78, 80 are positioned or otherwise located on the backplane 22 so that when the drawer 14 is inserted into the cavity 12 of the cabinet 10, and moved along the guide rails 26 to bring the backwall 20 into a confronting relation with the backplane 22, the tapered end portions of the alignment pins 78, 80 will spear and enter the alignment apertures 58, 60, respectively. Continued insertion of the drawer 14 to move the backwall 20 closer to the backplane 22 will cause the alignment pins 78, 80 to also pierce, enter and pass through the alignment apertures 48, 50 formed in the mounting plate 40. As movement of the drawer 14 into the cavity 12 continues, the alignment apertures 48, 50 and 58, 60 will be forced upon the larger diametered portions of the alignment pins 78, 80 until a snug fit is made between the alignment pins 78, 80 and (1) apertures 58, 60 and (2) apertures 48, 50. Thereby, the alignment apertures 58 (in the backwall 20) and 48 (in the mounting plate 40) snugly mates with the corresponding alignment pin 78. This accurately locates the X-Y dimensional planes of the backwall 20 and the mounting plate 40 to that of the backplane 22. The similarly snug fit between the vertical dimensions of the alignment apertures 40 and 60 and the alignment pin 80 effectively fixes the rotational positions (about the alignment pin 78) of the backwall 20 and the mounting plate 40 relative to the backplane 22.

To summarize thus far, the guide rails 26 operate to provide a pre-initial alignment, as the drawer 14 is moved into the cavity 12 of cabinet 10, so that the alignment apertures 58, 60 (and 48, 50) are positioned to receive the tapered ends of the alignment pins 78, 80. As the alignment pins 78, 80 enter the alignment apertures 58, 60 and 48, 50, the fit between the apertures 48, 58 and 50, 60 with the corresponding alignment pins 78, 80, the backwall 20, the mounting plate 40, and the backplane 22 are registered. Since the connector 34a is mounted to the mounting plate 40 in accurate location relative to the alignment apertures 48, 50, it is now also accurately registered to the alignment pins 78, 80. Thus, placement of the mating connector part 34b on the backplane 22 can, and does, accurately locate it relative to its mate, connector part 34a. Thereby, blind-matable connection of connector parts 34a, 34b is established.

In similar manner, since the connector part 36a is mounted to the drawer 14, accurately located relative to the backwall 20, the engagement of the alignment pins 78, 80 with the alignment apertures 58, 60 will accurately position the connector part 36a relative to the backplane 22. The mating connector part 34b is mounted to the backplane 22 in accurate location with the alignment pins 78, 80 to permit, when backwall 20 of the drawer 14 is moved into confronting position with the backplane 22 of the cabinet 10, blind-matable connection between the connector parts 36a, 36b.

Figure 7:
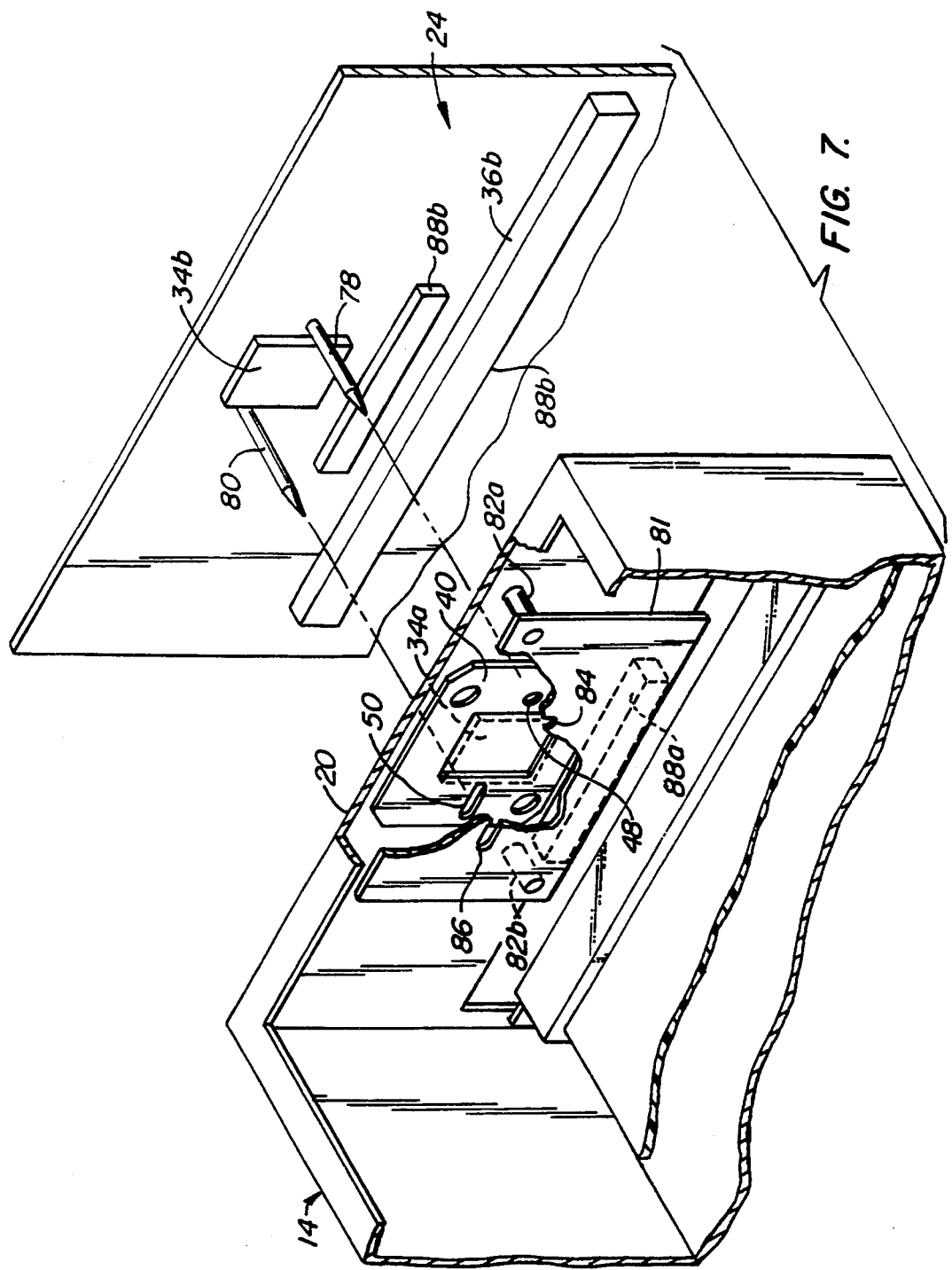
FIG. 7 is a perspective view, in partial section, illustrating an alternate embodiment of the invention.

Turning now to FIG. 7, an alternate embodiment of the invention, showing use of multiple floating mounting plates to provide simultaneous blind matable connection for a number of connectors, is illustrated. Reference numerals for elements that are the same as those of FIGS. 1–6 use the same reference numerals in FIG. 7. New elements will be given different reference numerals in FIG. 7.

As FIG. 7 shows, the drawer 14 continues to have mounted to the backwall 20 (which has formed therein the alignment apertures 58, 60, although not specifically shown in FIG. 7), the floating mounting plate 40 and the connector part 34a it carries. Mounting plate 40 continues to also have formed therein the alignment apertures 48, 50.

An additional floating mounting plate 81 is also mounted to the backwall 20 of the drawer 14 by a pair of stand-offs 82a, 82b, each located at a diagonal corner from the other of the mounting plate 80. As FIG. 7 shows, the stand-offs 82a, 82b are of a length to position the floating mounting plate 81 spaced from the floating mounting plate 40. As with the backwall 20 and the floating mounting plate 40, floating mounting plate 80 also has formed therein alignment apertures 84, 86. In addition, the floating mounting plate 80 can carry a connector part 88a that is mounted in accurate location relative to the alignment apertures 84, 86. The backplane 24 carries, in addition to the connector parts 34b, 36b, and alignment pins 78, 80, the mating connector part 88b for connector part 88a. The connector part 88b is, as are connector parts 34b and 36b (as discussed above), mounted relative to the alignment pins 78 and 80 so that when the alignment pins pick up and enter the alignment apertures 84, 86 formed in the floating mounting plate 81, the floating plate 80 will be registered to the backplane 24, placing the connector part 88a in mating engagement with connector part 88b.

Although not specifically shown in FIG. 7 for reasons of clarity, it will be appreciated that some sort of access may have to be provided the backwall 20 to permit mating engagement of the connector parts 88a, 88b similar to that (i.e., the rectangular opening 32, FIG. 2) for the connector part 36a.

In summary, there has been disclosed an alignment system capable of providing blind-matable connection between connector parts of two or more connectors. Although the system has been disclosed in connection with two separate connectors, there is no reason why more than two connectors could not be used, as long as the respective connector parts are accurately positioned on the backwall 20 and the backplane 22 relative to the alignment mechanism (i.e., alignment apertures 48, 50, 58, 60 and alignment pins 78, 80). Further, it is believed possible that the invention can be achieved with a single alignment pin configured to rotationally fix the backwall 20 of the drawer. For example, an alignment pin that is rectangular in section can operate to both fix the backwall in an X-Y and angular position relative to the alignment pin and, therefore, to the backwall to which it would be mounted. Thus, it will be evident to those skilled in the art that various modifications and alterations to the present invention can be made.

I claim:

1. An alignment system for blind-matable connection of at least a first pair of connector parts to second pair of connector parts mounted on a backplane of a cabinet that removably receives a drawer of the type formed from a chassis constructed to carry electrical and/or electronic apparatus, the drawer including a backwall integrally formed with the chassis and adapted to be placed in confronting, substantially parallel relation with the backplane when the drawer is received by the cabinet, the alignment system comprising:

first means for mounting one of the first pair of connector parts to the drawer, the backwall of the drawer having a first pair of apertures formed therein, the one of the first pair of connector parts being fixedly located relative to the first pair of apertures;

second means for floatably mounting the other of the first pair of connector parts to the backwall of the drawer, the second means including a planar mounting plate having the other connector part mounted thereto, the second means having a second pair of apertures formed therein located relative to the other connector part;

the second pair of apertures being alignable with the first pair of apertures;

alignment means mounted to the backplane for axially aligning the first and second pair of pairs of apertures when the backwall of the drawer is placed in confronting relation with the backplane of the cabinet; and third means for mounting the second connector parts to the backplane relative to the alignment means.

2. The alignment system of claim 1, wherein the backwall of the drawer is substantially planar, and the second means for mounting includes a planar plate mounted to the backwall and in a manner that permits the planar plate to be movable substantially parallel to the backwall.

3. The alignment system of claim 1, wherein the first means including a substantially planar circuit board mounted within the drawer generally perpendicular to the backwall, the one connector part being mounted to the circuit board.

4. The alignment system of claim 3, wherein the circuit board is mounted and accurately positioned relative to the backwall of the drawer.

5. The alignment system of claim 1, wherein the alignment means includes a pair of elongate pins, mounted to be received by the first pair of apertures and the second pair of apertures.

6. The alignment system of claim 5, wherein the elongate pins are tapered toward the terminus of each.

7. The alignment system of claim 6, wherein a one of the first pair of apertures, and a corresponding one of the second pair of apertures is generally circular and dimensioned to snugly receive a one of the pair of pins.

8. The alignment system of claim 7, wherein the other of the first pair of apertures and the other of the second pair of apertures is provided a generally oblong.

9. The alignment system of claim 7, wherein the other of the first pair of apertures and other of the second pair of apertures is generally oblong, having a longitudinal axis oriented generally toward the center of corresponding ones of the ones of the first and second apertures.

10. An alignment system for alignment of at least two separate connector parts for blind connection with two mating connector parts in a cabinet to establish electrical connection, the alignment system comprising:

first means for carrying a one of the two separate connector parts, the first means having a first pair of apertures formed therein, the one of the two separate connector parts being mounted substantially located relative to the first pair of apertures;

second means for mounting the other of the first pair of connector parts to the first means so that the second means is movable relative to the first means, the second means having a second pair of apertures formed therein in proximate alignment with the first pair of apertures, the other of the first pair of connector parts being mounted to the second means in substantially relative location to the second pair of apertures; and a pair of alignment pins mounted to the cabinet at a location to penetrate the first and second pairs of apertures when the first means is moved into proximate relation thereto; the second connector parts being mounted so as to be fixedly located relative to the alignment pins.

11. The alignment system of claim 10, wherein ones of the first and second pairs of apertures are shaped and configured to receive a one of the alignment pins in a manner that restricts movement in an X-Y direction.

12. The alignment system of claim 11, wherein the ones of the first and second pairs of apertures are circular in shape.

13. The alignment system of claim 12, wherein the other of the first and second pairs of apertures are oblong, each having a longitudinal axis oriented to point toward a center of the corresponding ones of the first and second apertures.

14. The alignment system of claim 10, wherein the cabinet includes an inward facing, planar backplane, the alignment pins being mounted to the backplane to extend inward of the cabinet.

15. The alignment system of claim 14, there being a third mating connector part in the cabinet and including third means for mounting an additional connector part to the first means so that the third means is movable relative to the first means and the second means, the third means having a third pair of apertures formed therein in proximate alignment with the first and second pair of apertures, the additional connector part being mounted to the third means in substantially relative location to the third pair of apertures; whereby the alignment pins penetrate the third pair of apertures to register the third means to the backplane and align the third mating connector part and additional connector part for mating engagement.

* * * * *